US007662302B2

(12) United States Patent
Elyaakoubi et al.

(10) Patent No.: US 7,662,302 B2
(45) Date of Patent: Feb. 16, 2010

(54) LIFTING AND SUPPORTING DEVICE

(75) Inventors: Mustapha Elyaakoubi, Massy (FR); Jacques Schmitt, La Ville du Bois (FR)

(73) Assignee: Oerlikon Solar IP AG, Trubbach, Trubbach (CH)

( * ) Notice: Subject to any disclaimer, the term of this patent is extended or adjusted under 35 U.S.C. 154(b) by 1061 days.

(21) Appl. No.: 10/484,174

(22) PCT Filed: Jul. 15, 2002

(86) PCT No.: PCT/EP02/07856

§ 371 (c)(1), (2), (4) Date: Jun. 21, 2004

(87) PCT Pub. No.: WO03/008323

PCT Pub. Date: Jan. 30, 2003

(65) Prior Publication Data

US 2004/0248391 A1    Dec. 9, 2004

(30) Foreign Application Priority Data

Jul. 16, 2001    (DE)    ................. 101 34 513

(51) Int. Cl.
*B44C 1/22*   (2006.01)
*C23C 16/00*  (2006.01)
*C23F 1/00*   (2006.01)

(52) U.S. Cl. ................ 216/58; 216/67; 118/715; 156/345.1

(58) Field of Classification Search ........... 216/58, 216/67; 156/345.1; 118/756
See application file for complete search history.

(56) References Cited

U.S. PATENT DOCUMENTS

| 5,491,603 | A | * | 2/1996 | Birang et al. | ............... 361/234 |
| 5,669,977 | A |   | 9/1997 | Shufflebotham et al. | |
| 5,677,824 | A | * | 10/1997 | Harashima et al. | .......... 361/234 |
| 5,796,066 | A | * | 8/1998 | Guyot | .................. 219/121.48 |
| 5,879,128 | A | * | 3/1999 | Tietz et al. | .................. 414/757 |
| 6,132,517 | A |   | 10/2000 | Sivaramakrishnan et al. | |
| 6,146,504 | A |   | 11/2000 | Patadia et al. | |

(Continued)

FOREIGN PATENT DOCUMENTS

EP    0821404    1/1998

(Continued)

*Primary Examiner*—Shamim Ahmed
(74) *Attorney, Agent, or Firm*—Price, Heneveld, Cooper, DeWitt & Litton, LLP

(57) ABSTRACT

The invention relates to a lifting and supporting device for handling and positioning particularly large-surface elements in the shape of panels, especially in plasma processing installations. Said lifting and supporting device comprises a particularly metallic base plate, on which a plurality of particularly dielectric pins are arranged. Said pins may be set in pin holes especially provided in the base plate. Said panel-shaped element may be positioned on the pin end for the handling thereof or during a plasma processing. Said panel-shaped element may present an electrostatic charge. A small diameter for the pins and pin holes is selected such that, in conformity with the panel-shaped element provided with the electrostatic charge, an undesired electrostatic charge on said panel-shaped element is essentially avoided or, in conformity with the panel-shaped element to be plasma processed, a plasma perturbation in the area of the pin holes or pins is essentially avoided.

53 Claims, 2 Drawing Sheets

U.S. PATENT DOCUMENTS

| | | |
|---|---|---|
| 6,214,122 B1 | 4/2001 | Thompson et al. |
| 6,227,786 B1 * | 5/2001 | Tateyama .................. 118/724 |
| 6,228,438 B1 | 5/2001 | Schmitt |
| 2002/0011204 A1 * | 1/2002 | Gujer et al. ................ 118/500 |

FOREIGN PATENT DOCUMENTS

| | | |
|---|---|---|
| JP | 9246362 | 9/1997 |

* cited by examiner

PRIOR ART

LIFTING AND SUPPORTING DEVICE

BACKGROUND OF THE INVENTION

The present invention relates to a lifting and supporting device for handling and positioning particularly large-surface elements in the shape of panels, especially in plasma processing installations, as well as a corresponding processing method and a device therefor.

During the processing and especially during the coating or etching of semiconductors, silicon wafers for the production of integrated circuits for example, or of dielectrics, as for example glass plates for the production of flat television screens, the substrates, which for the most part are in the form of panel-shaped elements, have to be transported, temporarily supported, etc., or, quite generally, have to be handled in a certain way either during a processing step or between one step and the next. Unlike what happens in other fields of processing logistics, however, this is associated with difficulties, because both the components and the processes are extremely sensitive and even very small perturbations could cause considerable harm to the components or even lead to their complete destruction.

A problem that arises quite generally in the handling of semiconductors, but particularly in the handling of dielectrics that carry such electrical circuits as, for example, thin film transistors, is the problem of the electrostatic charging and the subsequent undesired electrostatic discharge. As can be seen from the schematic illustration of FIG. 6, the various working processes, plasma coating processes being a case in point, but also friction events during the transport of the panel-shaped elements can cause the panel-shaped elements to become electrostatically charged. This charge on the panel-shaped element 4 is schematically represented in FIG. 6 and there indicated by the reference number 8. If the charged panel element is now brought to a different distance from ground potential, as can happen, for example, during the lifting of the panel-shaped element, potential differences will occur on the panel-shaped element 4 and in FIG. 6 are indicated by $V_1$ and $V_2$. These potential differences on the surface of the panel-shaped element can now have the effect of causing an electrostatic discharge across the circuits or thin film transistors applied to the surface. This is schematically illustrated in FIG. 6 inside the frame at the center of the figure. But the electrostatic discharge can lead to the destruction of the component, so that in case of doubt the entire panel-shaped element, complete with its plurality of circuits or thin film transistors, has to be regarded as a reject.

This problem has hitherto been tackled, first of all, by trying to avoid the charging of the panel-shaped elements by, for example, ionizing the surrounding air. But, it has been found that complete avoidance of electrostatic charging is hardly possible in actual practice. Another approach to the solution of the problem is the undesired electrostatic discharge is the one in which all the circuits applied to the semiconductor or the dielectric are short-circuited during the production process by means of the application of additional conductors, so-called bus bars. But this has the disadvantage that it is associated with the greater cost of first applying and subsequently removing the bus bars. Over and above this, the bus bars also constitute obstacles for the remainder of the production process.

Especially in the case of plasma processes, a further problem associated with the handling of panel-shaped elements consists of the fact that the presence of the lifting and supporting devices in the plasma chambers perturbs the plasma, which effects the properties of the elements to be processed with the plasma. In plasma processing installations, the elements that are to be processed with the plasma, e.g., such panel-shaped elements as, for example, silicon wafers or glass plates, are usually deposited on metallic base plates in order to be processed with the plasma. To this end, pins are provided at the edges of the base plate that can be made to descend into the base plate in order to permit the raising and lowering of the panel-shaped elements, so that a gripping device, the arm of a robot for example, with a fork-shaped holder can be inserted under the panel-shaped elements and transport them from one processing station to the next. The pins of the known lifting and supporting devices are arranged at the edge of the base plate, because the pin holes in which the pins are moving constitute inhomogeneities in the metallic base plate and can therefore lead to a modification of the plasma above these regions. However, a modification of the plasma above these regions would have the consequence that in this area, for example, the deposition of coatings or the etching by means of the plasma, would be perturbed. However, since circuits or thin film transistors, i.e. active elements, are not usually applied to the edges of the panel-shaped elements, the arrangement of the pins and the pin holes in these regions does not do any harm. However, as the size of the panel-shaped elements increases and their thickness diminishes, this will once again lead to problems, because pins will now have to be arranged also at the center of the base plate in order to assure adequate support for the panel-shaped elements when they are raised or lowered. In this way, however, the pin holes will create inhomogeneities in the region of the center of the lifting and supporting device, where it would likewise be desirable to have the possibility of producing active areas of the panel-shaped elements. Hitherto, this problem has been solved by producing several finished components on a single panel-shaped element that, on completion of the process, are separated from each other by cutting the panel-shaped element. It is therefore possible to provide appropriate pins in positions corresponding to the cutting regions, because perturbation of the plasma by pins and/or pin holes arranged in these regions will not have any harmful effects. However, since in the case of the production of, for example, flat television screens, we have a situation in which the individual active regions of the panel-shaped elements become greater while the thickness of the panel-shaped elements diminishes, this remedy is subject to certain limitations.

Furthermore it is known, from U.S. Pat. No. 6,228,438 B1 for example, that the elements to be processed in the plasma can be supported on pins in order to form a dielectric layer below the element to be processed. In this case, the pins will once again produce perturbations in the plasma in the neighborhood of the pins. These are attenuated by means of additional recesses around the pins in the base plate.

SUMMARY OF THE INVENTION

It is therefore the object of the present invention quite generally to create a lifting and supporting device that can be used in a plurality of processes for handling and supporting panel-shaped elements, especially with large surface areas, and avoids the problems illustrated above. In particular, it is the object of the present invention to create a lifting and supporting device for appropriate elements that will avoid damage due to undesired electrostatic discharges even in the absence of any additional and costly measures. Furthermore, the lifting and supporting device is to cause the least possible perturbation of a plasma intended for the processing of the panel-shaped elements, so that negative effects on the production and the properties of the panel-shaped elements can be avoided.

This object is attained by means of a lifting and supporting device in accordance with claim 1 or claim 4 and/or a method or a device for the processing of panel-shaped substrates in accordance with claim 18 or claim 19. Advantageous variants are described by the dependent claims.

A feature of the solution of the aforesaid task and all its partial aspects is that, given a lifting and supporting device with a base element on which there is provided a plurality of pins for carrying panel-shaped elements, the diameter of the pins and/or the pin holes into which the pins can be lowered is chosen to be sufficiently small that the problems described above can no longer occur and/or are substantially avoided. As will be explained in greater detail further on, it is precisely the thin and/or slender shape of the pins that solves various problems associated with traditional lifting and supporting devices of the kind described hereinabove.

Thus, as the inventors have demonstrated, the problem of the undesired electrostatic discharge is avoided by virtue of the fact that, given a thin design of dielectric pins, the production of potential differences on the surface of the panel-shaped elements is clearly reduced. Depending on the properties of the panel-shaped elements, for example the thickness and the type of the panel-shaped elements, for example semiconductors or dielectrics, as also on the number and the type of the electrical components, transistors for example, the reduction of the thickness of the pins leads to the avoidance of electrostatic discharges and therefore of damage to the panel-shaped elements that have to be handled. Advantageously, the pins will here be made of a dielectric material, because, given a base element preferably made of metal, in the case of plasma processing installations for example, pins capable of conducting would lead to the formation of considerable potential differences on the panel-shaped elements that could not be avoided even when the pins are designed to be thin.

With a view to making it possible for the panel-shaped elements supported on the pins to be displaced relative to the base element, the pins are preferably capable of being lowered into the base element, and to this end, pin holes are provided in the latter. The base element can be a plate, a grid, transport forks or the like.

When the lifting and supporting device in accordance with the invention is to be used in plasma processing installations, for example, for positioning the panel-shaped elements that are to be processed, during the plasma process, the panel-shaped element is usually deposited on the base plate, which is made of metal to facilitate the production of the plasma. For this use, the pins of the lifting and supporting device are likewise made to be capable of being lowered into the base plate, because they serve only for raising and lowering the panel-shaped elements. But, the pin holes provided for this purpose produce the inhomogeneities in the base element that perturb the plasma above them and are to be avoided in accordance with the invention. For this particular case, therefore, the diameter of the pin holes and consequently also the diameter of the pins that move in them has to be selected sufficiently small to substantially avoid a perturbation of the plasma and therefore damage to the panel-shaped element. Since a possible perturbation of the plasma by the inhomogeneities of the base element depends also on the plasma itself and on the element that is to be processed, the diameter of the pinholes and/or the pins must be chosen in conformity with the particular case.

In general, however, it has to be stressed that whenever it is desired to avoid the problem of undesired electrostatic discharges and to avoid also plasma perturbations, the diameter of the pins of the lifting and supporting device should be chosen as small as possible. The precise limit of the diameter of the pins and/or the pinholes has to be determined in conformity with the individual case, but this does not represent a problem for a person skilled in the art. On the basis of the knowledge of a person skilled in the art and the present disclosure, this limiting value can be determined in each individual case by means of appropriate tests or by means of numerical simulation.

In general, however, it has been found that, especially for the case of the lifting and supporting device being used in plasma processing installations, the diameter of the pins should be smaller than the thickness of the plasma sheath that surrounds the plasma.

Especially for avoiding undesired electrostatic discharges, it has been found advantageous if the diameter of the pins is less than a fifteenth part of their length that projects above the base element, especially the metallic base element. If the pin diameter is to be of advantageous size, it has thus been found that the diameter of the pins should be smaller than 3 mm, preferably smaller than 2 mm, and most preferably equal to 1.8 mm.

In order to assure an adequate support for the panel-shaped elements that are to be carried and to avoid making excessive demands on the pins, it is advantageous to provide an adequate number of pins per square meter of the area of the base element. Preferably, the number of pins per square meter of base element area should be greater than 5, even more preferably greater than 10, and especially greater than 15. Especially when the panel-shaped elements are very thin, as is the case, for example, with glass substrates for flat television screens, the average distance between pins should not be greater than 300 mm, and in all cases it will be advantageous if the pins are uniformly distributed over the base element.

In the case in which the lifting and supporting device for the avoidance of undesired electrostatic discharges comprises dielectric pins, it is preferred for the pins to be made of a dielectric with a low dielectric constant, since this will further reduce the danger of potential differences on the surface of the panel-shaped elements.

However, care will have to be taken to assure that the pins will also have suitable mechanical properties. To this end, it is particularly advantageous when the pins have an adequate elasticity, i.e. are made of an appropriately elastic material, for this will prevent the very thin pins from breaking when transverse forces are applied to them. Transverse forces may occur, for example, as a result of the thermal expansion of the supported panel-shaped elements during the processing or due to incorrect alignment of the pins when they are raised or lowered. Depending on the particular area in which the device is used, it has been found advantageous for the pins to be produced from a polymer or from a ceramic material. Particularly advantageous materials in this connection are polytetrafluorethylene, polyisobutylene, polyacrylate, polyethylene, as well as quartz, cordierite, aluminum oxide or zirconium.

With a view to reducing the transverse forces acting on the pin, it is also advantageous to avoid adhesion between the end of the pins on which the panel-shaped element is supported and the panel-shaped element. It is particularly important to avoid sticking. This can be obtained, for example, by having the pins arranged in such a manner as to enable them to rotate about their longitudinal axis. The rotation of the pins avoids an excessive adhesion between the ends of the pins and the panel-shaped element, so that the friction force needed for transferring transverse forces cannot be attained. As an alternative to rotation of the pins about their longitudinal axis, the pins could also be made to perform an oscillating translatory motion along their longitudinal axis. To this end, it may be advantageous to provide a Pierce oscillator capable of producing the translatory motions.

A further possibility of avoiding excessively large transverse forces consists of providing two mutually independent sets of pins that alternate in supporting the panel-shaped element or raising or lowering it.

With a view to avoiding excessively large transverse forces, it is also advantageous to design the end of the pins on which the panel-shaped element is supported in such a manner as not to make it possible for large friction forces to be produced. To this end, it is possible for their surface to be polished smooth or to apply a coating with a low coefficient of friction.

As already mentioned earlier on, it is possible for the lifting and supporting device to be employed when panel-shaped substrates have to be processed, especially when they have to be coated, preferably with PECVD, or when dielectric substrates have to be etched, especially by means of dry etching or plasma etching to use especially glass or semiconductor materials or to provide them in the appropriate installations.

Further advantages, features and characteristics of the present invention will be brought out more clearly by the following detailed description of a particular embodiment, which makes reference to the appended drawings.

BRIEF DESCRIPTION OF THE DRAWINGS

The drawings, all of which are purely schematic, show.

DETAILED DESCRIPTION OF THE PREFERRED EMBODIMENT

Figure 1:
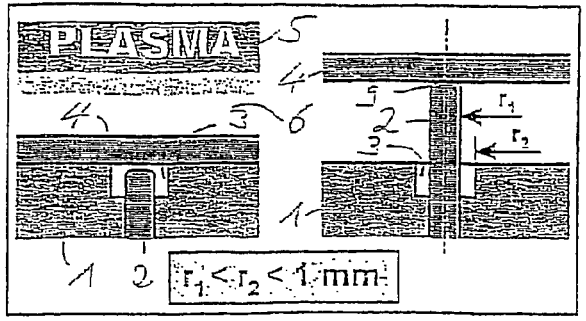
FIG. 1 is a cross-sectional view of a lifting and supporting device on which there is arranged a glass plate once during the plasma processing and again during the raising of the glass plate.

FIG. 1 shows, as a cross section and in two partial representations, a portion of an embodiment of the lifting and supporting device in accordance with the invention, where in the first view, the pin 2 is lowered into base plate 1 and the panel-shaped element 4 to be processed, a glass plate for example, is deposited on the base plate 1 and, in the other view, the pin 2 is raised and projects from the base plate 1 and carries the glass plate 4 on one of its ends 9. In the schematic representation of FIG. 1 the pin hole 3 is shown only in its upper region. However, the pin hole 3 may also be designed in such a manner as to have the same diameter over the whole of its length. To assure a better representation, however, the pin hole here shown has a clearly larger diameter in its upper region than the pin 2. Although this constitutes a possible embodiment, the preferred embodiment will usually be the one in which the pin hole 3 has no more than a minimally larger diameter than the pin 2 and, more precisely, only to such an extent as to permit the pin 2 to move freely in the pin hole 3. In this case, it will not be necessary to change the diameter of the pin hole 3 over its length.

As is likewise shown in FIG. 1, the lifting and supporting device is employed in the plasma processing of a glass plate 4. To this end, a plasma 5 is ignited above the glass plate 4 after the glass plate 4 has been placed on the metallic base plate 1. A plasma-free space is formed between the plasma 5 and the glass plate 4, which is here described as the plasma sheath 6. The plasma sheath 6 will usually have a thickness of 2 to 3 mm. Correspondingly, the preferred embodiment in accordance with FIG. 1 is designed in such a manner that both the diameter of the pinholes 3 and also the corresponding diameter of the pins 2 is smaller than the thickness of the plasma sheath 6. Consequently, the radius of the pin holes 3, as also the corresponding radius of the pins 2 in the illustrated embodiment, is less than 1 mm.

Figure 2:
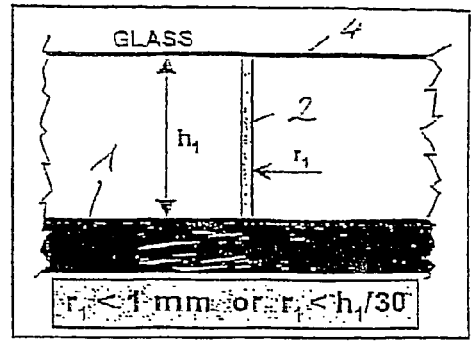
FIG. 2 is a cross section through the lifting and supporting device with a raised glass plate.

FIG. 2 likewise shows a portion of the cross section of an embodiment of the lifting and supporting device, where the pin 2 is fully raised out of the base plate (the pin hole 3 is not shown here). This embodiment schematically illustrates a further possibility of the design in accordance with the invention of the pins 2, namely that the radius of the pins 2 is smaller than the thirtieth part of its total height hi in the fully extended position. This embodiment is particularly intended for the handling of glass plates that are provided with circuits and are liable to be damaged as a result of undesired electrostatic discharges.

Figure 3:
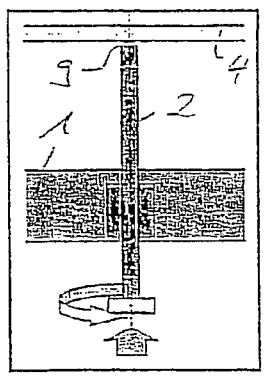
FIG. 3 is a cross section through the lifting and supporting device with a raised glass plate in which the pins are arranged to be rotatable.
Figure 4:
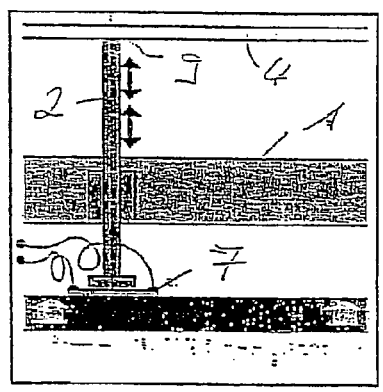
FIG. 4 is a cross section through a lifting and supporting device with a raised glass plate in which the pins can be made to oscillate along their longitudinal axis by means of a Pierce oscillator.
Figure 5:
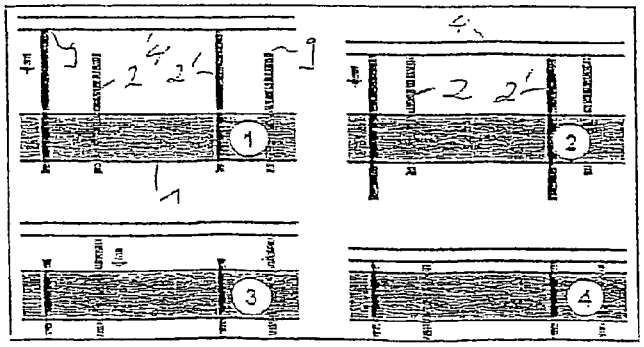
FIG. 5 is several cross sections though a lifting and supporting device during the lowering of a glass plate, where the lifting and supporting device is provided with two sets of pins that alternatingly support the glass plate, as well as a diagram that shows the path of the two sets of pins and the glass plate plotted against time.
Figure 5:
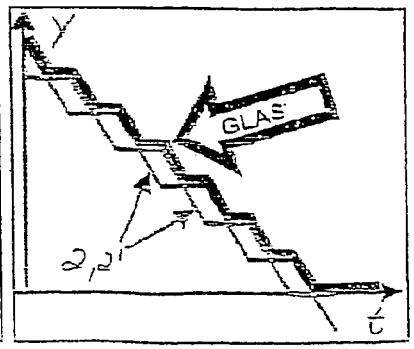
Figure 6:
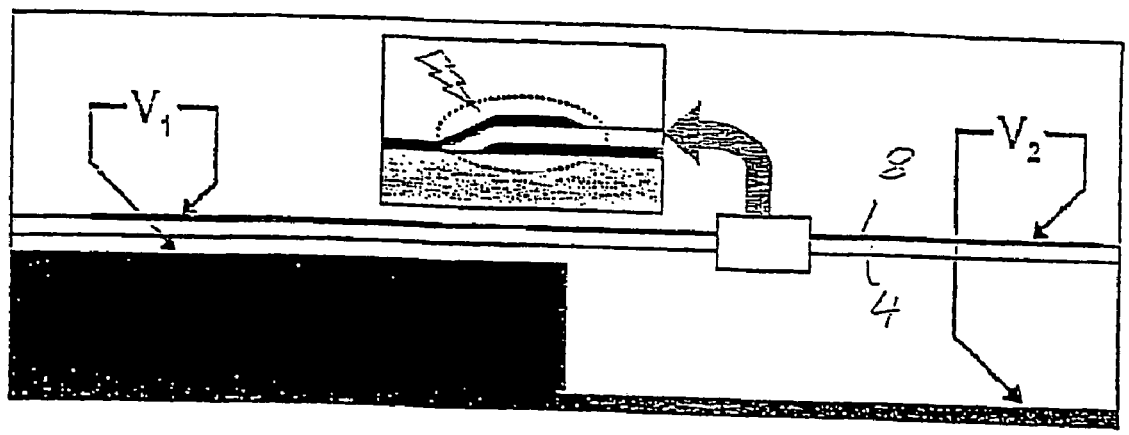
FIG. 6 is a schematic representation of the undesired inhomogeneous voltage distribution of a glass plate with an applied electrostatic charge at different distances from the base plate, where the voltage difference can lead to an undesired electrostatic discharge on the glass plate with the circuits provided thereon.

Each of FIGS. 3 to 5 shows portions of the cross section of lifting and supporting devices in accordance with the invention in which measures have been taken to avoid an excessive loading of the pins 2 due to undesired transverse forces when the panel-shaped elements 4 are raised or lowered. In particular, the embodiments shown in FIGS. 3 to 5 are designed with a view to avoiding an excessive adhesion between the ends 9 of the pins 2 on the one hand and the panel-shaped elements on the other, i.e. minimizing the friction forces.

In the embodiment in accordance with FIG. 3, the pins 2 are rotatably supported, so that they can rotate about their longitudinal axis. When they are raised or lowered or during processing of the panel-shaped elements 4, the pins 2 are rotated, so that sticking or adhesion of the ends 9 of the pins 2 to the panel-shaped elements is avoided. This precaution, once again, assures that no excessively strong transverse forces—as could result from, for example, an inexact orientation of the pins 2—can be exerted on the pins.

In the embodiment in accordance with FIG. 4, this problem of adhesion and/or transverse forces is solved by subjecting the pins 2 to translatory oscillations along the longitudinal axis of the pins 2 by means of, for example, a Pierce oscillator, so that the pins 2 will be periodically relieved of the load due to the panel-shaped element 4. In this case, once again, the precaution avoids the coming into being of an excessively strong bond between the end 9 of the pins 2 and the panel-shaped element 4, which could lead to the transfer of inadmissibly high transverse forces to the pins 2.

Yet another solution of this problem is shown in the embodiment in accordance with FIG. 5. In this case, two sets of pins 2 and 2' are provided in the lifting and supporting device in accordance with the invention, and alternate in performing the carrying function for the panel-shaped element 4 during raising or lowering or similar operations. This result can be obtained, for example, by moving the pins 2 in accordance with a stepped pattern in the path-time diagram, so that the panel-shaped element 4 will be alternatingly supported, first on the one set of pins 2 and then on the other set of pins 2'.

The invention claimed is:

1. A lifting and supporting device for handling and supporting particularly large-surface elements in the shape of panels in plasma processing installations, with a base plate on which there is arranged a plurality of dielectric pins on the ends of which the panel-shaped element can be supported for handling, where the panel-shaped element may carry an electrostatic charge, characterized in that the diameter of the pins is selected sufficiently small, so that, matched to the panel-shaped element carrying the electrostatic charge, an undesired electrostatic discharge on the panel-shaped element is substantially avoided, and wherein the diameter of the pins is less than 1 mm and also smaller than the thirtieth part of their length that can be raised above the base plate.

2. A lifting and supporting device in accordance with claim 1, characterized in that the pins can be lowered into pin holes provided on the base plate.

3. A lifting and supporting device in accordance with claim 1, characterized in that the diameter of the pins is smaller than the thickness of the plasma sheath.

4. A lifting and supporting device in accordance with claim 1, characterized in that the number of the pins per square meter of the surface area of the base plate is greater than 5.

5. A lifting and supporting device in accordance with claim 1, characterized in that the average distance between the pins is not greater than 300 mm and that the pins are uniformly distributed over the base plate.

6. A lifting and supporting device in accordance with claim 1, characterized in that the pins have a low dielectric coefficient.

7. A lifting and supporting device in accordance with claim 1, characterized in that the pins are made of an elastic material.

8. A lifting and supporting device in accordance with claim 1, characterized in that the pins are made of a polymer.

9. A lifting and supporting device in accordance with claim 1, characterized in that the pins are arranged so as to be rotatable about their longitudinal axis.

10. A lifting and supporting device in accordance with claim 1, characterized in that the pins can perform an oscillating sliding motion along their longitudinal axis.

11. A lifting and supporting device in accordance with claim 1, characterized in that there are provided two mutually independent sets of pins that render possible independent raising and lowering motions.

12. A lifting and supporting device in accordance with claim 1, characterized in that the pin ends on which the panel-shaped element is supported are provided with a polished surface and/or a coating with a low coefficient of friction.

13. A method of processing panel-shaped substrates, characterized in that the panel-shaped substrates are moved with the lifting and supporting device in accordance with claim 1.

14. Installation for processing panel-shaped substrates, characterized in that the installation comprises a lifting and supporting device in accordance with claim 1 for handling and supporting substrates that are moved, by the lifting and supporting device.

15. A lifting and supporting device in accordance with claim 4, characterized in that the number of pins per square meter of the surface area of the base plate is greater than 10.

16. A lifting and supporting device in accordance with claim 15, characterized in that the number of pins per square meter of the surface area of the base plate is greater than 15.

17. A lifting and supporting device in accordance with claim 8, characterized in that the pins are made of polytetrafluorethylene, polyisoethylene, polyacrylates or polyethylene.

18. A lifting and supporting device in accordance with claim 1, characterized in that the pins are made of a ceramic material.

19. A lifting and supporting device in accordance with claim 18, characterized in that the pins are made of quartz, cordierite, aluminum oxide or zirconium.

20. A method of processing panel-shaped substrates in accordance with claim 13, characterized in that the method includes coating the panel-shaped substrates.

21. A method of processing panel-shaped substrates in accordance with claim 20, characterized in that coating includes coating the panel-shaped substrates by means of plasma enhanced chemical vapor deposition.

22. A method of processing panel-shaped substrates in accordance with claim 13, characterized in that the method includes etching the panel-shaped substrates.

23. A method of processing panel-shaped substrates in accordance with claim 22, characterized in that etching includes dry etching.

24. A method of processing panel-shaped substrates in accordance with claim 22, characterized in that etching includes plasma etching.

25. A method of processing panel-shaped substrates in accordance with claim 13, characterized in that substrates are dielectric substrates.

26. A method of processing panel-shaped substrates in accordance with claim 25, characterized in that dielectric substrates are glass or semiconductor materials.

27. Installation for processing panel-shaped substrates in accordance with claim 14, characterized in that processing includes coating the panel-shaped substrates.

28. Installation for processing panel-shaped substrates in accordance with claim 27, characterized in that coating includes coating the panel-shaped substrates by means of plasma enhanced chemical vapor deposition.

29. Installation for processing panel-shaped substrates in accordance with claim 14, characterized in that the processing includes etching the panel-shaped substrates.

30. Installation for processing panel-shaped substrates in accordance with claim 29, characterized in that etching includes dry etching.

31. Installation for processing panel-shaped substrates in accordance with claim 29, characterized in that etching includes plasma etching.

32. Installation for processing panel-shaped substrates in accordance with claim 14, characterized in that substrates are dielectric substrates.

33. Installation for processing panel-shaped substrates in accordance with claim 32, characterized in that dielectric substrates are glass or semiconductor materials.

34. A lifting and supporting device for handling and supporting large-surface elements in the shape of panels in plasma processing installations, where the element may carry an electrostatic charge, comprising:

a metallic base plate having pin holes;

a plurality of pins that can be lowered into the pin holes;

the pins having ends on which the element can be supported for handling or during the plasma processing;

wherein the pins or the pin holes have a small diameter that substantially does not perturb plasma of the element in a region abutting the pins or the pin holes;

wherein the pins are made of dielectric material; and wherein the diameter of the pins is less than 1 mm and also smaller than the thirtieth part of their length that can be raised above the base plate.

35. A lifting and supporting device in accordance with claim 34, characterized in that the diameter of the pins is smaller than the thickness of a plasma sheath.

36. A lifting and supporting device in accordance with claim 34, characterized in that the number of the pins per square meter of a surface area of the base plate is greater than 5.

37. A lifting and supporting device in accordance with claim 36, characterized in that the number of the pins per square meter of a surface area of the base plate is greater than 10.

38. A lifting and supporting device in accordance with claim 37, characterized in that the number of the pins per square meter of a surface area of the base plate is greater than 15.

39. A lifting and supporting device in accordance with claims 34, characterized in that an average distance between the pins is not greater than 300 mm and that the pins are uniformly distributed over the base plate.

40. A lifting and supporting device in accordance with claim 34, characterized in that the pins have a low dielectric coefficient.

41. A lifting and supporting device in accordance with claim 34, characterized in that the pins are made of an elastic material.

42. A lifting and supporting device in accordance with claim 34, characterized in that the pins are made of a polymer or a ceramic material.

43. A lifting and supporting device in accordance with claim 42, characterized in that the pins are made of polytetrafluorethylene, polyisoethylene, polyacrylates or polyethylene.

44. A lifting and supporting device in accordance with claim 42, characterized in that the pins are made of quartz, cordierite, aluminum oxide or zirconium.

45. A lifting and supporting device in accordance with claim 34, characterized in that the pins are arranged so as to be rotatable about a longitudinal axis of the pins.

46. A lifting and supporting device in accordance with claim 34, characterized in that the pins can perform an oscillating sliding motion along a longitudinal axis of the pins.

47. A lifting and supporting device in accordance with claim 34, characterized in that there are provided two mutually independent sets of pins that render possible independent raising and lowering motions.

48. A lifting and supporting device in accordance with claim 34, characterized in that the ends on which the element is supported are provided with a polished surface and/or a coating with a low coefficient of friction.

49. A method of processing panel-shaped substrates comprising:

providing large-surface elements in the shape of panels in plasma processing installations, the element carrying an electrostatic charge;

providing a lifting and supporting device comprising a metallic base plate having pin holes and a plurality of pins that can be lowered into the pin holes supporting the element on ends of the pins;

substantially not perturbing plasma of the element in a region abutting the pins or the pinholes;

wherein the pins are made of dielectric material; and wherein the diameter of the pins is less than 1 mm and also smaller than the thirtieth part of their length that can be raised above the base plate.

50. A method of processing panel-shaped substrates in accordance with claim 49, characterized in that the method includes coating the elements.

51. A method of processing panel-shaped substrates in accordance with claim 49, characterized in that the method includes etching the elements.

52. A method of processing panel-shaped substrates in accordance with claim 51, characterized in that etching includes dry etching.

53. A method of processing panel-shaped substrates in accordance with claim 51, characterized in that etching includes plasma etching.

* * * * *